US010269638B2

(12) United States Patent
Abe

(10) Patent No.: US 10,269,638 B2
(45) Date of Patent: Apr. 23, 2019

(54) SEMICONDUCTOR APPARATUS, METHOD OF MANUFACTURING THE SAME, AND EQUIPMENT

(71) Applicant: CANON KABUSHIKI KAISHA, Tokyo (JP)

(72) Inventor: Kunihiro Abe, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/850,651

(22) Filed: Dec. 21, 2017

(65) Prior Publication Data
US 2018/0182670 A1 Jun. 28, 2018

(30) Foreign Application Priority Data

Dec. 28, 2016 (JP) ................. 2016-256769

(51) Int. Cl.
| H01L 21/306 | (2006.01) |
| H01L 21/768 | (2006.01) |
| H01L 29/51 | (2006.01) |
| H01L 21/683 | (2006.01) |
| H01L 21/311 | (2006.01) |
| H01L 23/31 | (2006.01) |
| H01L 21/02 | (2006.01) |
| H01L 21/78 | (2006.01) |

(Continued)

(52) U.S. Cl.
CPC .... *H01L 21/76898* (2013.01); *H01L 21/0212* (2013.01); *H01L 21/02271* (2013.01); *H01L 21/30655* (2013.01); *H01L 21/31116* (2013.01); *H01L 21/6836* (2013.01); *H01L 21/76811* (2013.01); *H01L 21/78* (2013.01); *H01L 23/3185* (2013.01); *H01L 27/14685* (2013.01); *H01L 27/14687* (2013.01); *H01L 29/51* (2013.01); *H01L 21/561* (2013.01); *H01L 23/562* (2013.01)

(58) Field of Classification Search
CPC .................................. H01L 21/30655
USPC ........................................ 148/33.3
See application file for complete search history.

(56) References Cited

U.S. PATENT DOCUMENTS

| 6,051,503 | A | 4/2000 | Bhardwaj | |
| 2006/0205182 | A1* | 9/2006 | Soejima | H01L 21/78 |
| | | | | 438/460 |

(Continued)

FOREIGN PATENT DOCUMENTS

| JP | 2012-18956 A | 1/2012 |
| JP | 2012-28654 A | 2/2012 |

(Continued)

*Primary Examiner* — George R Fourson, III
(74) *Attorney, Agent, or Firm* — Canon U.S.A., Inc. IP Division

(57) ABSTRACT

A semiconductor apparatus includes a semiconductor substrate having an upper surface on which a semiconductor element is disposed, a lower surface opposite to the upper surface, and a side surface connecting the upper surface and the lower surface. The side surface has a plurality of concavities that each extend along the edge of the upper surface and that are arranged in a direction intersecting with the upper surface and the lower surface, and a plurality of ridges that are each located at the boundary between adjacent two of the plurality of concavities. The plurality of concavities and the plurality of ridges are covered with an insulating film containing carbon and fluorine.

14 Claims, 6 Drawing Sheets

(51) Int. Cl.
    *H01L 21/3065*     (2006.01)
    *H01L 27/146*     (2006.01)
    *H01L 21/56*     (2006.01)
    *H01L 23/00*     (2006.01)

(56) References Cited

U.S. PATENT DOCUMENTS

| | | | |
|---|---|---|---|
| 2008/0121042 A1* | 5/2008 | Miller | B81B 3/0078 |
| | | | 73/649 |
| 2009/0042366 A1* | 2/2009 | Grivna | H01L 21/78 |
| | | | 438/460 |
| 2009/0189257 A1 | 7/2009 | Seki | |
| 2011/0177675 A1* | 7/2011 | Grivna | H01L 21/30655 |
| | | | 438/462 |
| 2013/0230971 A1 | 9/2013 | Geerpuram | |
| 2013/0344683 A1 | 12/2013 | Lazerand | |
| 2014/0017881 A1 | 1/2014 | Eaton | |
| 2014/0070376 A1* | 3/2014 | Hess | H01L 21/30655 |
| | | | 257/632 |
| 2014/0087562 A1 | 3/2014 | Ikarashi | |
| 2014/0295644 A1 | 10/2014 | Harikai | |
| 2015/0011073 A1 | 1/2015 | Lei | |
| 2015/0118849 A1* | 4/2015 | Oda | H01L 21/308 |
| | | | 438/701 |
| 2015/0228504 A1* | 8/2015 | Takesawa | H01L 24/03 |
| | | | 257/693 |
| 2015/0262879 A1 | 9/2015 | Sakai | |
| 2016/0056080 A1 | 2/2016 | Takahashi | |
| 2016/0071767 A1 | 3/2016 | Hashimoto | |
| 2016/0322306 A1* | 11/2016 | Roesner | H01L 23/544 |
| 2017/0263502 A1* | 9/2017 | Okita | H01L 21/3065 |
| 2017/0263525 A1* | 9/2017 | Mizuno | H01L 21/268 |
| 2017/0263526 A1* | 9/2017 | Mizuno | H01L 21/0212 |
| 2018/0012802 A1* | 1/2018 | Okita | H01L 21/3081 |
| 2018/0096952 A1* | 4/2018 | Miccoli | H01L 23/562 |
| 2018/0240678 A1* | 8/2018 | Itou | H01L 21/30655 |

FOREIGN PATENT DOCUMENTS

| | | |
|---|---|---|
| JP | 2013-165100 A | 8/2013 |
| JP | 2016-39279 A | 3/2016 |
| JP | 2016-40795 A | 3/2016 |
| JP | 2016-58741 A | 4/2016 |
| JP | 2016-207774 A | 12/2016 |

* cited by examiner

SEMICONDUCTOR APPARATUS, METHOD OF MANUFACTURING THE SAME, AND EQUIPMENT

BACKGROUND OF THE INVENTION

Field of the Invention

The present disclosure relates to a semiconductor apparatus, a method of manufacturing the same, and a camera.

Description of the Related Art

Dicing with a blade is generally used in the step of dividing a substrate on which semiconductor elements are formed into respective semiconductor chips. A minute crack is sometimes formed in the side surface of the substrate of the semiconductor chip divided by the blade. Due to this minute crack, when mechanical stress or impact is applied to the side surface of the substrate of the semiconductor chip in the step of incorporating the semiconductor chip into a module, chipping of the side surface of the substrate may occur. Japanese Patent Laid-Open No. 2012-28654 discloses dividing a substrate by plasma etching in order to suppress chipping.

SUMMARY OF THE INVENTION

A semiconductor apparatus according to the present disclosure includes a semiconductor substrate having an upper surface on which a semiconductor element is disposed, a lower surface opposite to the upper surface, and a side surface connecting the upper surface and the lower surface. The side surface has a plurality of concavities that each extend along the edge of the upper surface and that are arranged in a direction intersecting with the upper surface and the lower surface, and a plurality of ridges that are each located at the boundary between adjacent two of the plurality of concavities. The plurality of concavities and the plurality of ridges are covered with an insulating film containing carbon and fluorine.

Further features of the present disclosure will become apparent from the following description of exemplary embodiments with reference to the attached drawings.

DESCRIPTION OF THE EMBODIMENTS

Figure 1A:
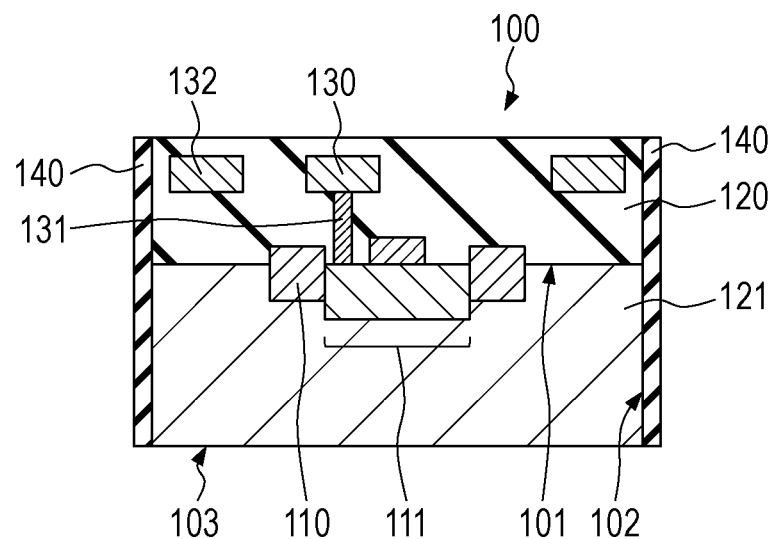
FIGS. 1A and 1B are sectional views showing a configuration example of a semiconductor chip and a semiconductor apparatus according to an embodiment of the present disclosure.

Japanese Patent Laid-Open No. 2012-28654 discloses dividing a substrate on which semiconductor elements are formed into respective semiconductor chips by anisotropic dry etching. However, when dividing a substrate only by anisotropic dry etching, it takes time to etch the substrate, and the productivity may decrease. Plasma etching of a substrate using the Bosch process for improving productivity is known. The Bosch process divides a substrate into respective semiconductor chips by repeating an isotropic etching step, a step of forming a protective film on the side surface and the bottom surface of the groove of the etched substrate, and a step of etching the protective film formed on the bottom surface. An unevenness called scallop is formed on the side surface of the groove formed by the Bosch process. In the step of conveying a semiconductor chip obtained by dividing by the Bosch process, when a conveying jig is brought into contact with the side surface of the substrate, chipping may occur with the protrusion of the scallop as a starting point.

The present disclosure provides a technique for suppressing chipping occurring on the side surface of a semiconductor substrate.

In view of the above problems, a semiconductor apparatus according to an embodiment includes a semiconductor substrate having an upper surface on which a semiconductor element is disposed, a lower surface opposite to the upper surface, and a side surface connecting the upper surface and the lower surface. The side surface has a plurality of concavities that each extend along the edge of the upper surface and that are arranged in a direction intersecting with the upper surface and the lower surface, and a plurality of ridges that are each located at the boundary between adjacent two of the plurality of concavities. The plurality of concavities and the plurality of ridges are covered with an insulating film containing carbon and fluorine.

A technique for suppressing chipping occurring on the side surface of a semiconductor substrate is provided by the above means.

Hereinafter, specific embodiments of the semiconductor apparatus according to the present disclosure will be described with reference to the accompanying drawings. In the following description and drawings, common reference numerals are used for common configurations across a plurality of drawings. For this reason, common configurations will be described with reference to a plurality of drawings, and the description of configurations denoted by common reference numerals will be omitted as appropriate.

First Embodiment

With reference to FIGS. 1A to 3C, a configuration and a manufacturing method of a semiconductor apparatus according to an embodiment of the present disclosure will be described. FIG. 1A is a sectional view showing a configuration of a semiconductor chip 100 according to a first embodiment of the present disclosure. The semiconductor chip 100 includes a substrate 121, and a semiconductor element 111, an element isolation portion 110, an interlayer insulating film 120, a wiring pattern 130, a plug 131, and an electrode portion 132 that are formed on an upper surface 101 that is one of the two main surfaces of the substrate 121. The semiconductor chip 100 further includes an insulating film 140 that covers the side surface 102 of the substrate 121.

The substrate 121 is a semiconductor substrate formed of a semiconductor such as single crystal silicon. The substrate 121 has an upper surface 101 on which the semiconductor element 111 is disposed, a lower surface 103 opposite to the upper surface 101, and a side surface 102 connecting the upper surface 101 and the lower surface 103. The upper surface 101 and the lower surface 103 of the substrate 121 can be surfaces existing before the step of dividing the substrate 121 into respective semiconductor chips 100 described later. The side surface 102 is a surface appearing by the dividing step. On the upper surface 101 of the substrate 121, a semiconductor element 111 such as a transistor or a diode is disposed. In FIG. 1A, one element is depicted as the semiconductor element 111, but actually, a large number of semiconductor elements can be formed. The interlayer insulating film 120 is disposed on the upper surface 101 of the substrate 121 on which the semiconductor element 111 and others are disposed. The interlayer insulating film 120 may cover the entire upper surface 101 of the substrate 121. The interlayer insulating film 120 can be formed of an insulating material such as silicon oxide, silicon nitride, or silicon carbide.

The wiring pattern 130 is disposed in the interlayer insulating film 120. In the configuration shown in FIG. 1A, the wiring pattern 130 is depicted as a single-layer layer wiring layer, but the wiring pattern 130 may be composed of a plurality of wiring layers. In that case, the wiring layers are connected by conductor plugs. The wiring pattern 130 is formed of a metal such as copper or aluminum. The electrode portion 132 is disposed in the interlayer insulating film 120, and can be a wiring pattern connected to an electrode pad for sending and receiving signals between the semiconductor chip 100 and the outside of the semiconductor chip 100 and for receiving power supply. The electrode portion 132 can be formed of the same wiring layer and the same material as the wiring pattern 130. The electrode portion 132 can be connected to the wiring pattern 130. The plug 131 is formed of a metal such as tungsten, and electrically connects the semiconductor element 111 and the wiring pattern 130. When the wiring pattern 130, the plug 131, and the electrode portion 132 are formed of a metal such as copper, there is a possibility that the metal diffuses into the substrate 121 via the interlayer insulating film 120. In order to prevent diffusion of metal, the wiring pattern 130, the plug 131, and the electrode portion 132 may be provided with a barrier metal layer formed of titanium, tantalum, nitride thereof, or the like.

Figure 1B:
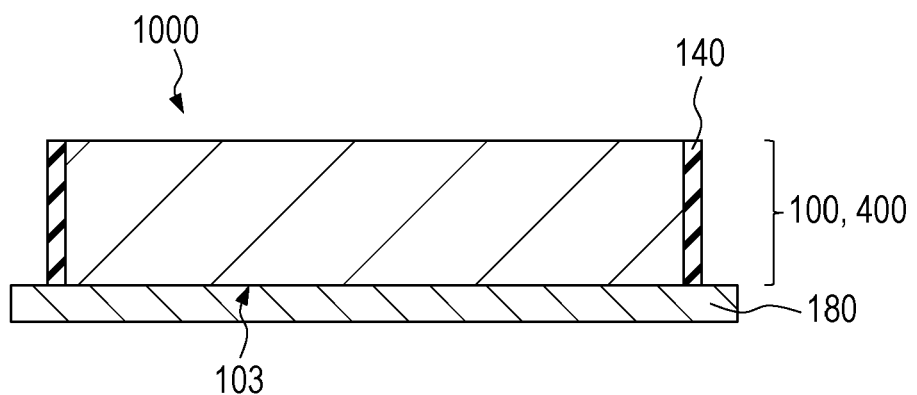

The side surface 102 of the substrate 121 of the semiconductor chip 100 is covered with an insulating film 140 containing carbon and fluorine. As shown in FIGS. 1A and 1B, the insulating film 140 continuously covers the side surface 102 of the substrate 121 from the edge of the upper surface 101 of the substrate 121 to the edge of the lower surface 103. It can also be said that the insulating film 140 covers the entire area of the side surface 102 of the substrate 121. The insulating film 140 can also be disposed on the side surface of the interlayer insulating film 120. Details of the insulating film 140 will be described later.

As shown in FIG. 1B, the semiconductor chip 100 is fixed on a base 180 of a semiconductor apparatus 1000, for example, such that the lower surface 103 of the substrate 121 opposite to the upper surface 101 on which the semiconductor element 111 is disposed faces down. In addition, the semiconductor chip 100 can be electrically connected to the outside of the semiconductor chip 100 via an electrode pad connected to the electrode portion 132, thereby forming the semiconductor apparatus 1000. The base 180 is a package member included in the semiconductor apparatus 1000. The form of the package may be a chip size package.

Next, with reference to FIGS. 2A to 2G, a manufacturing method for dividing (individualizing) a substrate 121 on which semiconductor elements 111 are formed into individual semiconductor chips 100 will be described. Known semiconductor manufacturing processes can be used for individual processes for manufacturing the semiconductor elements 111. Although omitted in the following description, a process such as a heat treatment or a cleaning treatment can be performed between the respective steps as needed.

Figure 2A:
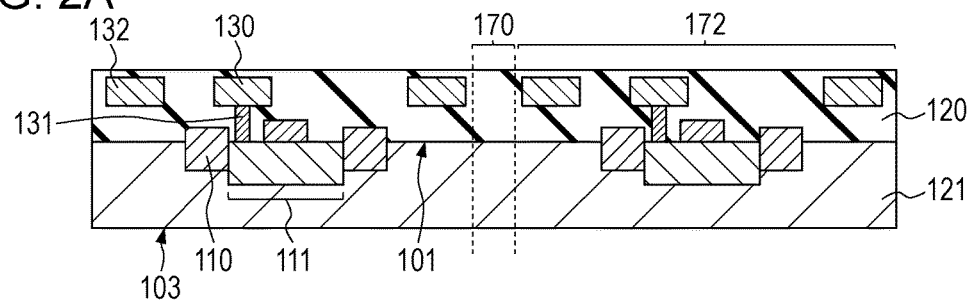
FIGS. 2A to 2G are sectional views showing a method of manufacturing of the semiconductor chip of FIGS. 1A and 1B.

First, in the step shown in FIG. 2A, a substrate 121 (wafer) formed of a semiconductor such as silicon is prepared, and semiconductor elements 111 and others are formed on the upper surface 101 of the substrate 121. Further, element isolation portions 110 such as STI (Shallow Trench Isolation) are formed on the upper surface 101 of the substrate 121, and adjacent semiconductor elements 111 can be electrically separated. On the substrate 121 on which the semiconductor elements 111 are formed, an interlayer insulating film 120, and conductors such as wiring patterns 130 and electrode portions 132 disposed in the interlayer insulating film 120 and plugs 131 for electrically connecting the wiring patterns 130 and the semiconductor elements 111, are formed. The interlayer insulating film 120 is formed of an insulating material such as silicon oxide, silicon nitride, or silicon oxynitride.

As the steps of forming the interlayer insulating film 120, the wiring patterns 130, the electrode portions 132, and the plugs 131, for example, the following steps can be used. First, a BPSG (Boron Phosphorus Silicon Glass) film is formed by a sub-atmospheric pressure CVD method. In the interlayer insulating film 120, in order to connect the semiconductor elements 111 and the wiring patterns 130, contact holes are formed at desired positions of the BPSG, and a conductive material such as tungsten is embedded in the contact holes to form the plugs 131. Subsequently, a film of a conductive material such as aluminum is formed on the interlayer insulating film 120 by a sputtering method or the like, and then dry etching is performed through a photoresist or the like patterned in a desired shape, whereby the wiring pattern 130 and the electrode portion 132 are formed. The wiring patterns 130 and the electrode portions 132 may be formed by a damascene method. On the wiring patterns 130 and the electrode portions 132, silicon oxide is formed by a plasma CVD method. As described above, in this embodiment, the interlayer insulating film 120 can include the above-described BPSG and silicon oxide. When the wiring patterns 130 have a plurality of layers, formation of the plugs 131, formation of the wiring patterns 130, and formation of an insulating material such as silicon oxide forming the interlayer insulating film 120 may be repeated.

Figure 2B:
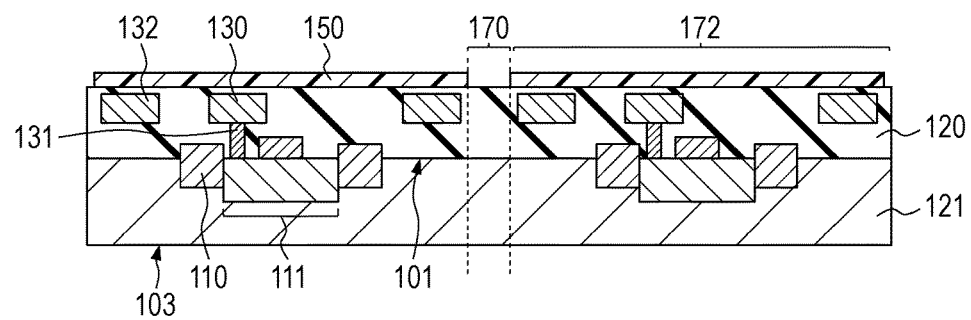

Next, as shown in FIG. 2B, a mask pattern 150 is formed. The mask pattern 150 has an opening above a scribe area 170 that is located between a plurality of device areas 172 in which the semiconductor elements 111 are formed and that is for separating the substrate 121 into individual semiconductor chips 100. It can be said that the device areas 172 of the substrate 121 that are made into individual semiconductor chips 100 are separated by this scribe area 170. The mask pattern 150 can be formed by, for example, a photolithography process in which photoresist is applied to the interlayer insulating film 120 and then exposure and development is performed.

Figure 2C:
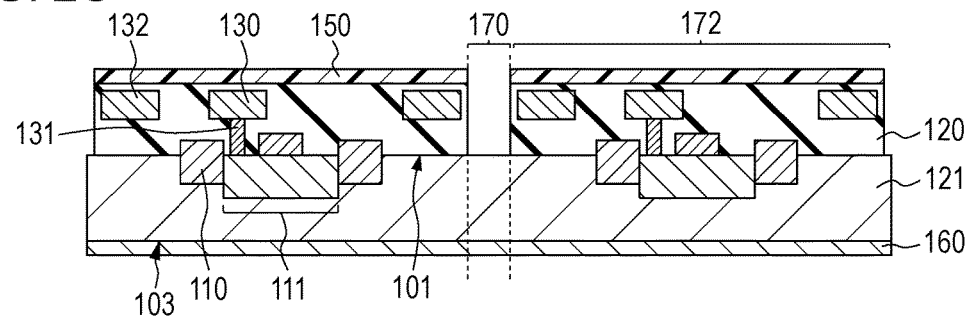

After the formation of the mask pattern 150, as shown in FIG. 2C, the interlayer insulating film 120 disposed above the scribe area 170 is etched through the opening of the mask pattern 150 to expose the substrate 121. For etching the interlayer insulating film 120, dry etching (plasma etching) using plasma can be used. After etching the interlayer insulating film 120, a dicing tape 160 is applied to the lower surface 103, which is one of the main surfaces of the substrate 121 opposite to the upper surface 101 on which the semiconductor elements 111 are disposed. As the dicing tape 160, a UV peeling tape or the like can be used. The dicing tape 160 may be applied before etching the interlayer insulating film 120.

Figure 2D:
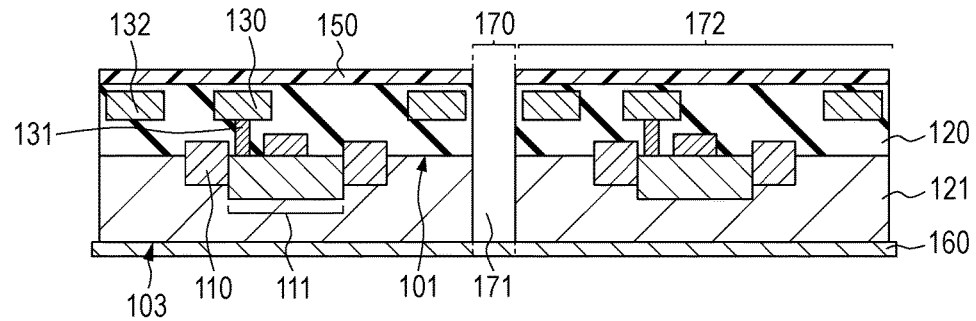

Next, as shown in FIG. 2D, by performing dry etching through the opening of the mask pattern 150, a groove 171 is formed in the scribe area 170 of the substrate 121, and the substrate 121 is divided. For etching the substrate 121, a so-called Bosch process can be used.

Here, the Bosch process is a process in which (1) the step of isotropically etching the substrate 121, (2) the step of forming a protective film, and (3) the step of removing the protective film formed on the bottom surface of the groove, are performed as one cycle, the steps (1) to (3) are switched at high speed in a short time, and this cycle is repeated. In the step (1) of isotropically etching the substrate 121, a gas such as $SF_6$ is used, and etching of the substrate 121 proceeds mainly with radicals as reactive species. When this step (1) is carried out for a long time, since the etching amount of the side surface of the groove 171 to be formed becomes large, switching to the step (2) of forming the protective film is performed in a short time (for example, about several seconds). In the step (2) of forming a protective film, a protective film containing carbon and fluorine is deposited on the surface of the groove 171 by decomposing a gas such as $C_4F_8$ in the plasma. This step (2) is also switched to the next step (3) in a short time of about several seconds. In the step (3) of removing part of the formed protective film, specifically the protective film on the bottom surface of the groove 171, a gas such as $SF_6$ is used as a gas system. At this time, by applying a relatively high bias power to the stage side of the etching apparatus in which the substrate 121 is placed, ions having anisotropy are made incident on the substrate 121. By this dry etching having anisotropy, the protective film at the bottom of the groove 171 is etched and removed. At this time, since the ions are hardly incident on the side surface of the groove 171 as compared with the bottom surface, the protective film is not removed. In the step (1) of isotropically etching in the next cycle, the side surface of the groove is covered with the protective film, and etching of the bottom surface of the groove 171 proceeds. By repeating this cycle, it is possible to advance etching in the direction orthogonal to the upper surface 101 of the substrate 121 little by little in the depth direction of the substrate 121. As a result, the substrate 121 on which the semiconductor elements 111 are formed is divided individually. In this embodiment, although the Bosch process repeating the above-described cycle of steps (1) to (3) is used, another process repeating a predetermined cycle may be used. For example, steps such as a cleaning step and a heat treatment step may be interposed between the above steps. Also, for example, etching having anisotropy and deposition of a protective film may be repeated as one cycle.

Figure 3A:
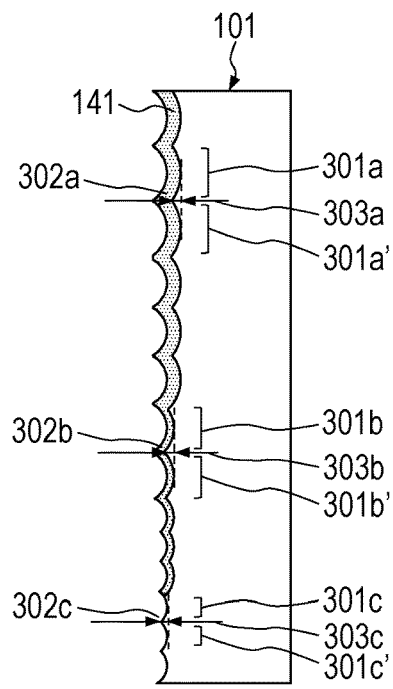
FIGS. 3A to 3C are enlarged views of the side surface of the substrate of the semiconductor chip of FIGS. 1A and 1B.

Next, the shape of the side surface 102 of the substrate 121 divided using the Bosch process will be described with reference to FIGS. 3A to 3C. In the side surface 102 of the substrate 121 of the semiconductor chip 100 formed by the groove formed by the Bosch process, a plurality of concavities 301 are formed that are concaved in an arc shape of several 10 nm to several μm in the section orthogonal to the upper surface 101 of the substrate 121 shown in FIG. 3A. The plurality of concavities 301 are arranged in a direction intersecting with the upper surface 101 and the lower surface 103 of the substrate 121 so as to form a ridge 302 at the boundary between adjacent concavities 301. In other words, a plurality of concavities 301 and a plurality of ridges 302 that are each located at the boundary between two adjacent concavities 301 are arranged in a direction intersecting with the upper surface 101 and the lower surface 103 of the substrate 121. The plurality of concavities 301 and the plurality of ridges 302 may be arranged in a direction orthogonal to the upper surface 101 and the lower surface 103 of the substrate 121. As shown in the side view of the substrate 121 of FIG. 3C, the concavities 301 and the ridges 302 extend linearly along the edge of the upper surface 101 of the substrate 121 on which the semiconductor element 111 is disposed. The plurality of concavities 301 and the plurality of ridges 302 may extend parallel to the edge of the upper surface 101 of the substrate 121. Here, in this specification, when a specific one of the plurality of concavities 301 is indicated, it is distinguished by adding an alphabet after the reference numeral for example concavity 301"a", and when not specifying, concavity 301. The same applies to other configurations.

In this embodiment, by performing etching from the side of the upper surface 101 of the substrate 121, the concavity 301 on the side close to the edge of the upper surface 101 is deep and the concavities 301 can become shallower as the distance from the edge of the upper surface 101 is increased. For example, consider the ridges 302a, 302b, and 302c shown in FIG. 3A as ridges 302 formed at the boundary between two adjacent concavities 301. The ridge 302a is a ridge located at the boundary between adjacent concavities 301a and 301a'. The ridge 302b is a ridge located at the boundary between adjacent concavities 301b and 301b' that are further away from the edge of the upper surface 101 of the substrate 121 than the concavities 301a and 301a'. The ridge 302c is a ridge located at the boundary between adjacent concavities 301c and 301c' that are further away from the edge of the upper surface 101 of the substrate 121 than the concavities 301b and 301b'. At this time, the difference in level 303a of an unevenness composed of the concavities 301a and 301a' and the ridge 302a may be equal to or greater than the difference in level 303b of an unevenness composed of the concavities 301b and 301b' and the ridge 302b. In addition, the difference in level 303b of the unevenness composed of the concavities 301b and 301b' and the ridge 302b may be equal to or greater than the difference in level 303c of an unevenness composed of the concavities 301c and 301c' and the ridge 302c. In other words, among unevennesses composed of two adjacent concavities 301 and one ridge 302 located between the two concavities 301, the difference in level of an unevenness near the upper surface 101 of the substrate 121 is equal to or greater than the difference in level of an unevenness away from the edge of the upper surface 101. Further, the difference in level of each unevenness composed of two adjacent concavities 301 and one ridge 302 located at the boundary between the two concavities may decrease continuously or stepwise as the distance from the edge of the upper surface 101 of the substrate 121 increases. For example, the difference in level 303a of the unevenness composed of the concavities 301a and 301a' and the ridge 302a near the edge of the upper surface 101 of the substrate 121 may be 500 nm. The difference in level 303c of the unevenness composed of the concavities 301c and 301c' and the ridge 302c near the lower surface 103 may be 200 nm.

Here, the difference in level 303a of the unevenness composed of the concavities 301a and 301a' and the ridge 302a may be the difference in height between the bottom of the concavity 301a and the ridge 302a or the difference in height between the bottom of the concavity 301a' and the ridge 302a. Further, as shown in FIG. 3A, the difference in level 303a may be the difference in height between a line connecting the bottom of the concavity 301a and the bottom of the concavity 301a' and the ridge 302a. The same is true for the difference in level 303b of the unevenness composed of the concavities 301b and 301b' and the ridge 302b and the difference in level 303c of the unevenness composed of the concavities 301c and 301c' and the ridge 302c.

Next, the protective film 141 formed on the side surface 102 of the substrate 121 of the semiconductor chip 100 will be described. As shown in FIG. 3A, the protective film 141 is gradually deposited on the side surface 102 of the substrate 121 every time the above-described cycle (1) to (3) is repeated during the Bosch process. Therefore, as the distance from the upper surface 101 increases, the number of cycles to be repeated decreases, and the protective film 141 on the side surface of the groove 171 formed in the substrate 121 becomes thin, for example, only about several 10 nm. Further, in the step of peeling off the mask pattern 150 after the Bosch process, there is a possibility that a part of the protective film 141 is removed, and there is a possibility that the side surface 102 of the substrate 121 is not covered with the protective film 141 in the vicinity of the lower surface 103 opposite to the upper surface 101. For this reason, in the conveying step after chip formation, for example, when grasping the side surface of the substrate 121 with a conveying tool, external force concentrates on the ridge 302 and chipping may occur with the ridge 302 as a starting point.

Figure 3B:
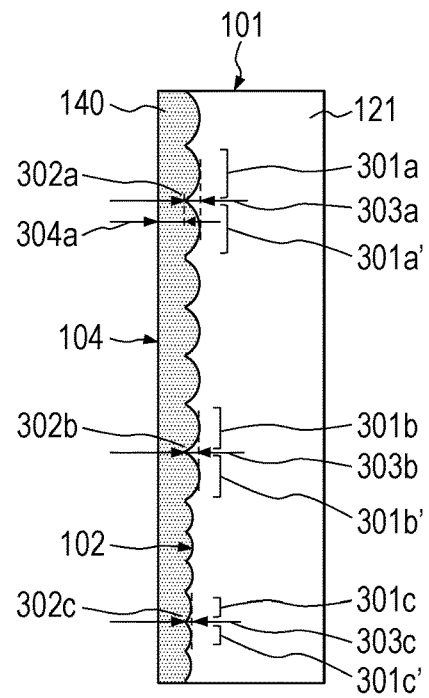
Figure 3C:
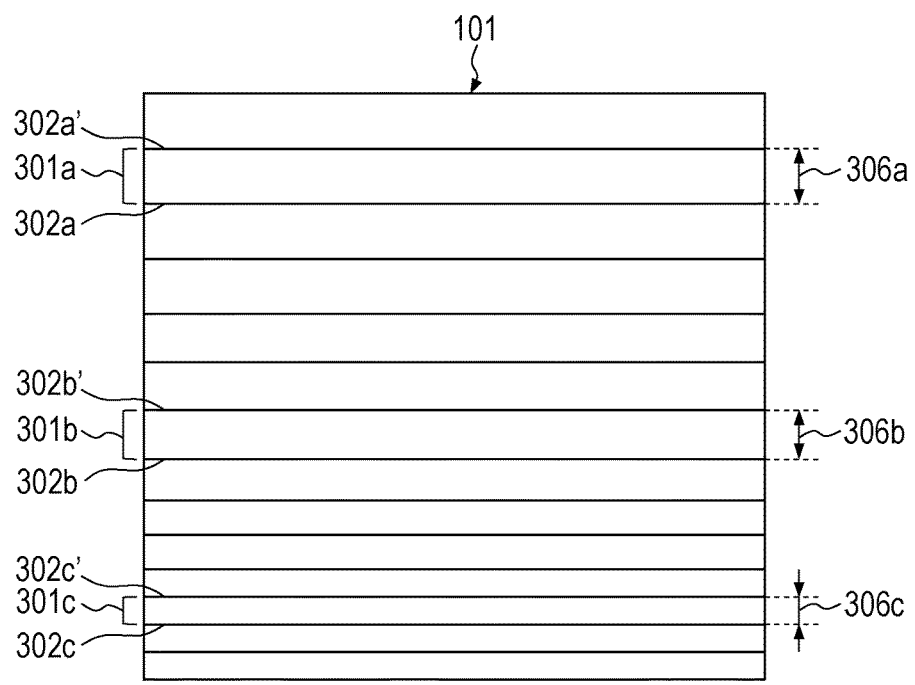

In order to suppress chipping starting from the ridge 302, in this embodiment, as shown in FIG. 3B, the plurality of concavities 301 and the plurality of ridges 302 are covered with an insulating film 140 for protecting unevenness. The insulating film 140 may continuously cover the side surface 102 from the edge of the upper surface 101 to the edge of the lower surface 103 of the substrate 121. In order to cover unevenness formed by the concavity 301 and the ridge 302 with the insulating film 140, it is necessary to add a film forming step for forming the insulating film 140 in addition to the protective film 141 laminated in the cycle in the Bosch process described above.

Here, in order to reduce the difference in level of the uneven structure after the formation of the insulating film 140, the difference in level of the unevenness before forming the insulating film 140 may be made small. In the Bosch process, shortening the time of isotropically etching step (1) reduces the difference in level of the uneven structure, but it takes a long time to etch. On the other hand, since the protective film 141 deposited during etching is thin as described above, the groove 171 formed in the vicinity of the lower surface 103 side of the substrate 121 may be etched under such a condition that the difference in level of unevenness becomes small in advance. Specifically, the time of step (1) of isotropically etching the upper surface 101 side is denoted as T1 (second). The time of step (1) of isotropically etching the lower surface 103 side is denoted as T2 (second). The relationship between the time T1 and the time T2 may be such that the time T1≥the time T2. The time of step (1) of etching the substrate isotropically in the repeated cycle of steps (1) to (3) may be decreased continuously or stepwise as the cycle proceeds.

Even in the case where the time T1=the time T2, the etching rate slows as the etching proceeds from the upper surface 101 to the lower surface 103 side, so that the difference in level of unevenness can gradually decrease. Further, by making the time T1≥the time T2, the difference in level of the uneven structure formed on the lower surface 103 side becomes smaller than the difference in level of the uneven structure formed on the upper surface 101 side. In the case where the difference in level of the unevenness on the lower surface 103 side is small, in the subsequent step of forming the insulating film 140, the difference in level can be planarized even with a thinner film thickness.

The distance between a concavity 301 in the case where the time of step (1) performing isotropic etching is changed as described above and ridges 302 formed at the boundaries between the concavity 301 and concavities 301 adjacent to the concavity 301 will be described with reference to FIG. 3C. Of the plurality of concavities 301, a concavity 301a has ridges 302a and 302a' formed at the boundaries with concavities 301 adjacent to the concavity 301a, and the ridges 302a and 302a' are separated by a distance 306a. Likewise, ridges 302b and 302b' are formed at the boundaries between a concavity 301b that is further away from the edge of the upper surface 101 of the substrate 121 than the concavity 301a and concavities 301 adjacent to the concavity 301b, and the ridges 302b and 302b' are separated by a distance 306b. Likewise, ridges 302c and 302c' are formed at the boundaries between a concavity 301c that is further away from the edge of the upper surface 101 of the substrate 121 than the concavity 301b and concavities 301 adjacent to the concavity 301c, and the ridges 302c and 302c' are separated by a distance 306c. At this time, the distance between the ridge 302a and the ridge 302a' may be equal to or greater than the distance between the ridge 302b and the ridge 302b'. In other words, the distance 306a may be equal to or greater than the distance 306b. Likewise, the distance between the ridge 302b and the ridge 302b' may be equal to or greater than the distance between the ridge 302c and the ridge 302c'. In other words, the distance 306b may be equal to or greater than the distance 306c. In other words, the distance between ridges 302 formed at the boundaries between each concavity 301 and two concavities 301 adjacent to each concavity 301 may decrease continuously or stepwise as the distance from the edge of the upper surface 101 of the substrate 121 increases.

Figure 2E:
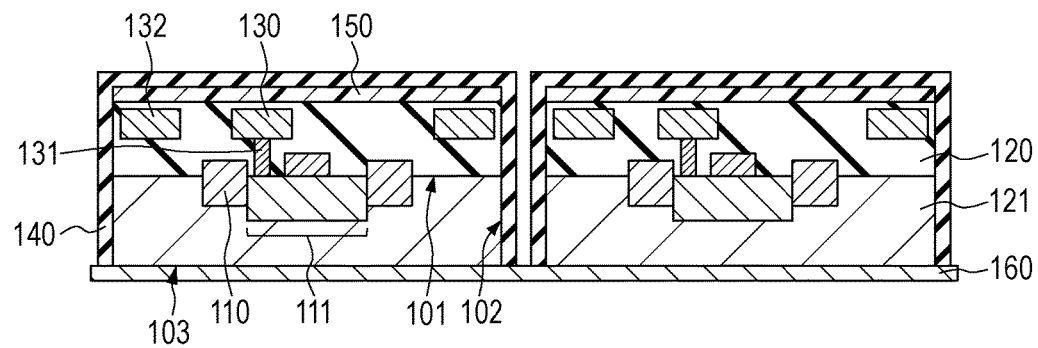

Next, as shown in FIG. 2E, an insulating film 140 covering the concavities 301 and the ridges 302 of the side surface 102 of the substrate 121 is formed on the substrate 121 divided by the dividing step using the Bosch process as described above. Here, the process conditions for forming the insulating film 140 may include the same conditions as those in the step (2) of forming the protective film 141 in the above cycle. For example, the process gas used in the process of forming the insulating film 140 and the process gas used in the step (2) of forming the protective film 141 in the above cycle may be the same process gas. For example, the process conditions for forming the insulating film 140 may be the same as the process conditions of the step (2) of forming the protective film 141 in the above cycle, except for the time for film formation. In the film forming step of forming the insulating film 140, for example, the time of the step (2) of forming the protective film 141 in the Bosch process described above is several seconds, whereas by setting the time to about several minutes under the same process conditions, the insulating film 140 can be thickly formed on the side surface 102 of the substrate 121. In this embodiment, the insulating film 140 and the protective film 141 are formed using the following process conditions.

Process gas: $C_4F_8$ 300 sccm
Upper electrode power: 2000 W
Lower (substrate-side) electrode power: 0 W
Pressure: 8 Pa In this embodiment, $C_4F_8$ is used as the process gas, but fluorocarbon type and hydrofluorocarbon type gases such as $CF_4$, $C_3F_8$, $C_4F_6$, $C_3F_8$, $CHF_3$, and $CH_2F_2$ can be used. In addition to the process gas, an appropriate carrier gas can be used. In this embodiment, the insulating film 140 is formed by plasma polymerization, but the insulating film 140 may be formed by gas phase polymerization method or the like.

If the film thickness of the insulating film 140 can cover at least the ridges 302 of the uneven structure, an effect of reducing chipping can be obtained. For example, by setting the film thickness of parts of the insulating film 140 that cover the ridges 302 to 100 nm or more, the ridges 302 can be covered and the angle of the acute-angled ridges 302 is increased. Thereby, concentration of external force on the ridge 302 is suppressed, and mechanical strength can be imparted. On the other hand, when the insulating film 140 is too thick, it takes time for ashing before removing the mask pattern 150 in a later step, so the film thickness of parts of the insulating film 140 that cover the ridges 302 may be 10 μm or less. The thickness 304 of a part of the insulating film 140 that covers one ridge 302 located at the boundary between two adjacent concavities 301 may be greater than the difference in level 303 of an unevenness composed of the two concavities 301 and the one ridge 302. By increasing the film thickness of parts of the insulating film 140 that are disposed on the ridges 302, it is possible to more appropriately suppress the damage of the fragile ridges 302, which tend to become the starting point of chipping.

Here, the insulating film 140 can have a part formed on the side surface 102 of the substrate 121 with the protective film 141 therebetween. However, since the insulating film 140 and the protective film 141 are formed under the same process conditions as described above, it is assumed that the film thickness of the protective film 141 is included in the film thickness of the insulating film 140. In other words, "the film thickness of the insulating film 140" also includes the film thickness of the laminated film of the insulating film 140 and the protective film 141.

Through the above film formation step, the side surface 102 of the substrate 121 is covered with the insulating film 140 or the laminated film of the insulating film 140 and the protective film 141. The insulating film 140 (the laminated film of the insulating film 140 and the protective film 141) has a first surface in contact with the side surface 102 of the substrate 121 or in contact with the side surface 102 with the protective film 141 therebetween, and a second surface 104 opposite to the first surface. As shown in FIG. 3B, the second surface 104 may have higher flatness than the side surface 102 of the substrate 121. For example, the difference in level of a part of the second surface 104 of the insulating film 140 that is above an unevenness composed of two adjacent concavities 301 and a ridge 302 formed at the boundary between the two concavities 301 may be smaller than the difference in level of the unevenness. By making the second surface 104 of the insulating film 140 flatter than the side surface 102 of the substrate 121, it is possible to obtain an effect of suppressing chipping.

The insulating film 140 and the protective film 141 formed by using the above-described process gas are polymers containing carbon and fluorine. In addition, in the case where the mask pattern 150 is formed of a photoresist, there is a possibility that carbon and nitrogen derived from the photoresist are taken into the insulating film 140 and the protective film 141. In this case, the insulating film 140 can be a polymer containing carbon, fluorine and nitrogen. The insulating film 140 and the protective film 141 containing carbon and fluorine have good adhesion to the substrate 121 serving as a base, are dense and flexible, and are excellent in chemical resistance. Therefore, as compared with the case where the insulating film 140 is formed of an inorganic material such as SiN, the insulating film 140 is resistant to mechanical stress and impact and can be effective for reducing chipping.

Figure 2F:
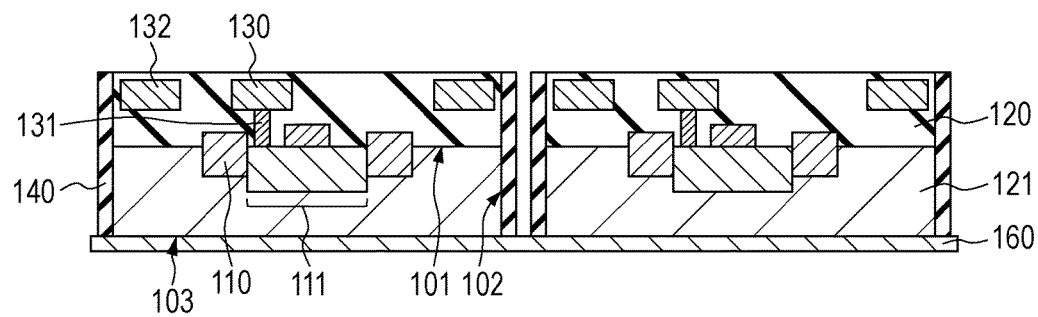
Figure 2G:
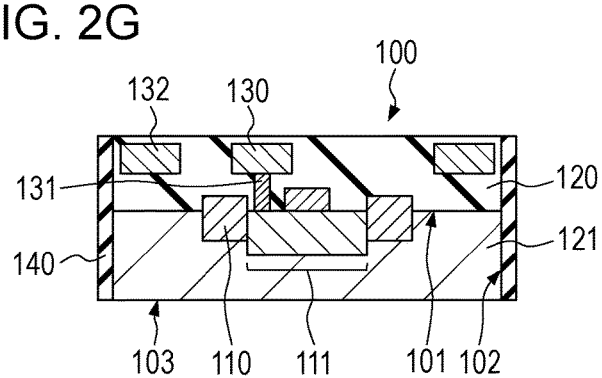

After forming the insulating film 140, as shown in FIG. 2F, the mask pattern 150 formed on the upper surface 101 of the substrate 121 is peeled off. At this time, since the insulating film 140 is also formed on the mask pattern 150, first, the insulating film 140 on the mask pattern 150 is removed by ashing, and then the mask pattern 150 is removed using a peeling liquid or the like. Next, as shown in FIG. 2G, semiconductor chips 100 are peeled off from the dicing tape 160, and individual semiconductor chips 100 are obtained.

In this embodiment, when the substrate 121 on which the semiconductor elements 111 are formed is divided into respective semiconductor chips 100, the step of forming the insulating film 140 on the side surface 102 of the substrate 121 divided by the Bosch process is added. At this time, the entire area of the side surface 102 of the substrate 121 is covered with the insulating film 140 using the same semiconductor manufacturing apparatus as the semiconductor manufacturing apparatus used in the Bosch process under the same process conditions as in the step (2) of forming the protective film of the Bosch process. As a result, chipping can be suppressed while minimizing an increase in the number of steps. The dividing step of dividing the substrate 121 using the Bosch process and the film forming step of forming the insulating film 140 may be performed continuously in the same semiconductor manufacturing apparatus without carrying the substrate 121 out of the semiconductor manufacturing apparatus. This makes it possible to suppress an increase in the number of steps. The insulating film 140 may be decomposed, peeled off, or removed by washing treatment, heat treatment, etching treatment, plasma treatment or the like in various steps after the formation of the insulating film 140. Then, there is a possibility that the insulating film 140 becomes extremely thin, or all or a part of the side surface 102 of the substrate 121 is exposed. Therefore, it becomes difficult to protect the side surface 102 which is an uneven surface. Therefore, in the steps performed after the insulating film 140 is formed, it is necessary to prevent the insulating film 140 from being decomposed, peeled off, or removed.

Second Embodiment

Figure 4A:
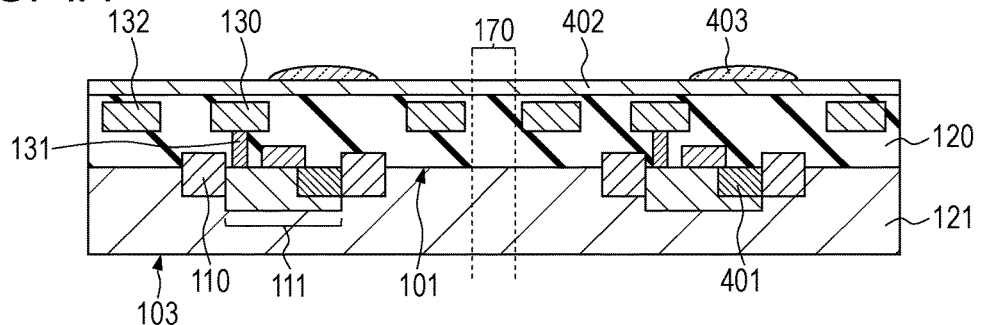
FIGS. 4A to 4G are sectional views illustrating a method of manufacturing a modification of the semiconductor chip of FIGS. 1A and 1B.
Figure 4B:
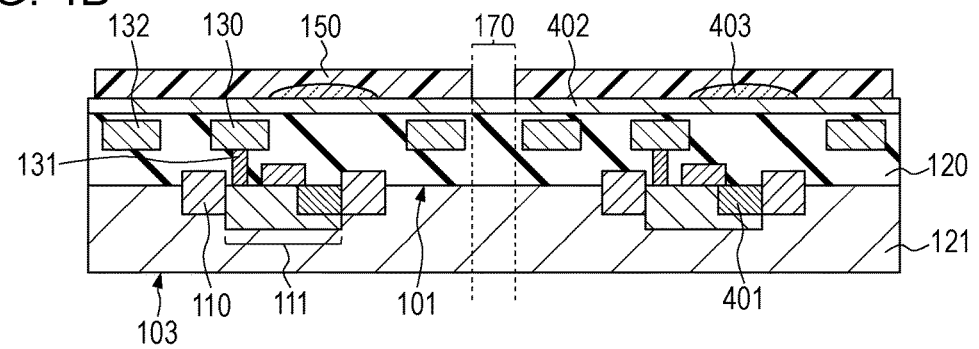
Figure 4C:
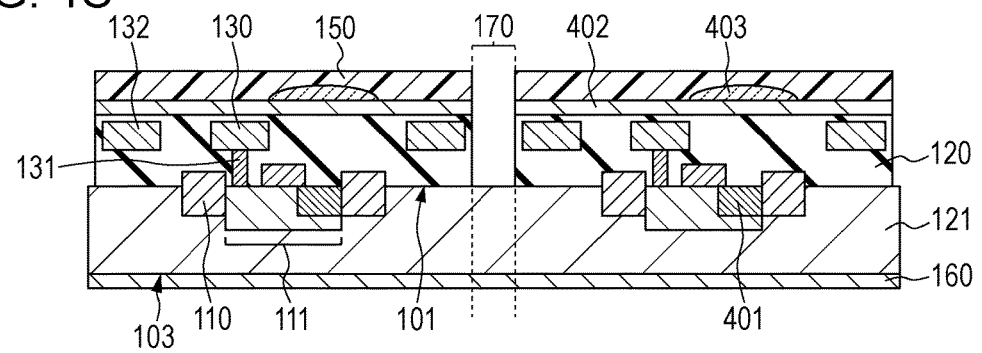
Figure 4D:
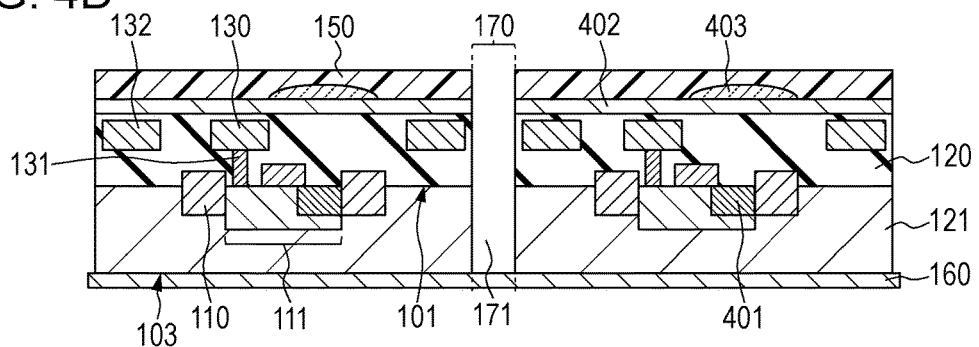
Figure 4E:
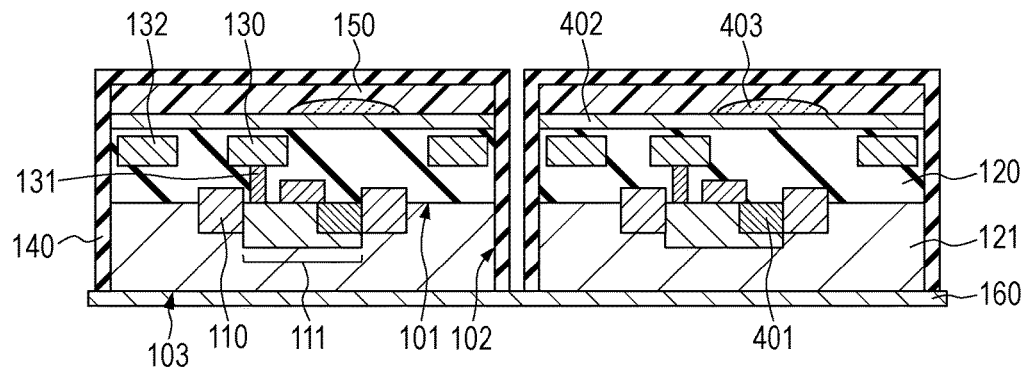
Figure 4F:
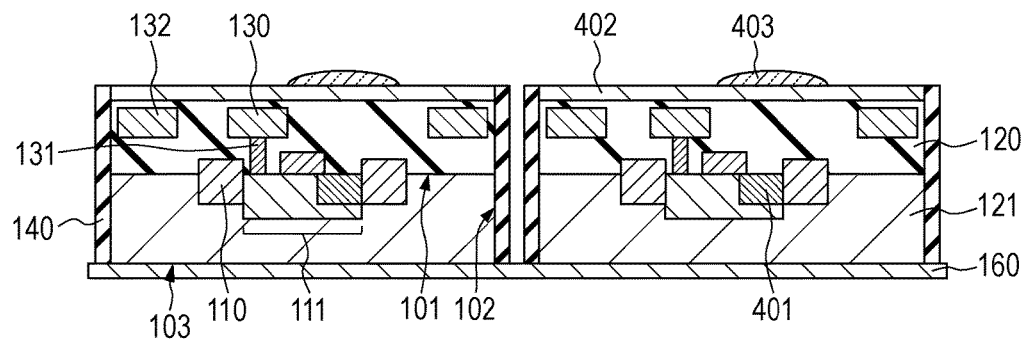
Figure 4G:
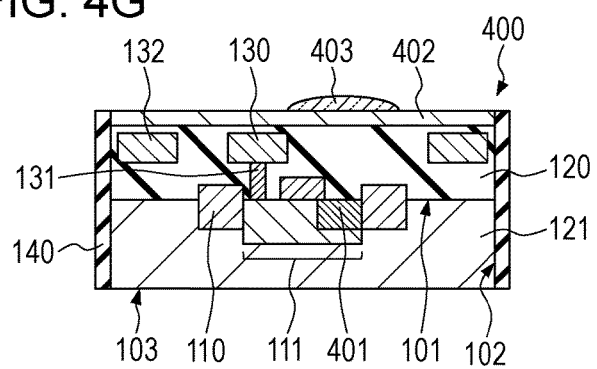

With reference to FIGS. 4A to 4G, a structure of a semiconductor apparatus and a method of manufacturing the same according to an embodiment of the present disclosure will be described. FIGS. 4A to 4G are sectional views showing a configuration and a manufacturing method of a semiconductor chip 400 according to a second embodiment of the present disclosure. This embodiment differs from the above-described first embodiment in that as shown in FIG. 4G, some of a large number of semiconductor elements 111 disposed in a semiconductor chip 400 are image pickup elements each including a photoelectric conversion unit 401 such as a photodiode for generating a signal corresponding to incident light. In addition, the semiconductor chip 400 of this embodiment may include a color filter 402 and a microlens 403 disposed above the image pickup element. In other respects, the semiconductor chip 400 may have the same configuration as the semiconductor chip 100 described in the first embodiment. For example, as shown in FIG. 1B, as with the semiconductor chip 100 described above, the semiconductor chip 400 can form the semiconductor apparatus 1000.

In FIG. 4G, one image pickup element is depicted as the semiconductor element 111, but actually, a large number of image pickup elements and semiconductor elements can be formed. The plurality of image pickup elements form a pixel area, and the surface of the pixel area composed of the color filter 402 and the microlens 403 is a light receiving surface. A planarization layer for suppressing the difference in level formed by the color filter may be disposed between the color filter 402 and the microlens 403. Of the semiconductor elements 111, the image pickup element including the photoelectric conversion unit 401 may be a CCD image sensor, a CMOS image sensor, or the like.

In the step shown in FIG. 4A, the semiconductor elements 111 including the image pickup elements are formed on the upper surface 101 of the substrate 121. On the substrate 121 on which the semiconductor elements 111 are formed, an interlayer insulating film 120, and wiring patterns 130, electrode portions 132, plugs 131, and the like disposed in the interlayer insulating film 120 are formed. These may be formed using a known semiconductor manufacturing process as in the first embodiment described above. A color filter 402 and microlenses 403 are formed above the image pickup elements each including the photoelectric conversion unit 401.

Next, in the steps shown in FIGS. 4B to 4G, steps similar to the steps shown in FIGS. 2B to 2G of the above-described first embodiment can be carried out. In the step shown in FIG. 4B, a mask pattern 150 having an opening above the scribe area 170 is formed on the surface 101 of the substrate 121. The scribe area 170 may be a lattice-like pattern located between the device areas in which the semiconductor elements 111 are disposed. After the mask pattern 150 is formed, in the step shown in FIG. 4C, the interlayer insulating film 120 in the scribe area 170 is dry-etched to expose the substrate 121. Thereafter, a dicing tape 160 is applied to the lower surface 103 of the substrate 121 opposite to the upper surface 101 on which the semiconductor elements 111 including the image pickup elements are formed. Next, in the step shown in FIG. 4D, a groove is formed in the scribe area 170 by using the Bosch process, and the substrate 121 is divided. Similarly to the above-described first embodiment, after dividing the substrate 121, in the step shown in FIG. 4E, the unevenness of the groove (the side surface 102 of the substrate 121) formed by the Bosch process is covered with the insulating film 140. After the formation of the insulating film 140, in the step shown in FIG. 4F, the mask pattern 150 formed on the surface 101 of the substrate 121 is peeled off. At this time, the insulating film 140 formed on the light receiving surface is removed together with the mask pattern 150 in the step of peeling off the mask pattern 150.

Japanese Patent Laid-Open No. 2012-28654 discloses a manufacturing method in which a protective film is formed on the side surface of a substrate of a semiconductor apparatus in order to suppress chipping, but since the protective film is formed on the side surface of the substrate after peeling off the mask pattern, there is a problem that the number of steps increases. In the method disclosed in Japanese Patent Laid-Open No. 2012-28654, since the protective film is formed after peeling off the mask pattern, when it is applied to a light receiving element such as an image pickup element, there is a possibility that the optical characteristics are impaired by the formation of the protective film on the light receiving surface. On the other hand, in this embodiment, the insulating film 140 formed on the light receiving surface is removed in the step of removing the mask pattern 150. Therefore, the insulating film 140 can be formed on the side surface 102 of the substrate 121 of the semiconductor chip 400 without impairing the optical characteristics of the image pickup element.

After peeling off the mask pattern 150, as shown in FIG. 4G, the substrate 121 is peeled off from the dicing tape 160, and individual semiconductor chips 400 are obtained.

In this embodiment, the step of forming the insulating film 140 on the substrate 121 divided by the Bosch process is added. The concavities 301 and the ridges 302 of the side surface 102 of the substrate 121 of the semiconductor chip 400 are covered with the insulating film 140. In the step of forming the insulating film 140, by using the same process conditions and the same semiconductor manufacturing apparatus as in the step (2) of forming the protective film 141 used in the Bosch process, chipping can be suppressed while minimizing an increase in the number of steps. In addition, since the insulating film 140 does not remain on the light receiving surface of the image pickup element, it is possible to reduce the deterioration of the optical characteristics of the image pickup element.

As an application example of the semiconductor apparatus 1000 including the semiconductor chip 400 including the image pickup element according to this embodiment, a camera incorporating the semiconductor apparatus 1000 will be exemplarily described. The concept of the camera includes not only equipment mainly for photographing but also equipment (for example, a personal computer, a portable terminal) that has a photographing function as a subsidiary function. The camera includes a semiconductor apparatus 1000 including the semiconductor chip 400 according to the present disclosure exemplified as the above embodiment and a signal processing unit that processes information based on a signal output from the semiconductor apparatus 1000. The signal processing unit can include a processor that processes digital data that is image data. The A/D converter that generates this image data may be included in the semiconductor chip 100, or can be provided in a semiconductor chip other than the semiconductor chip 100 disposed in the semiconductor apparatus 1000, or can be provided separately from the semiconductor apparatus 1000.

While two embodiments of the present disclosure have been described above, it goes without saying that the present invention is not limited to these embodiments, and the above-described embodiments can be appropriately changed and combined without departing from the gist of the present disclosure.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-256769 filed Dec. 28, 2016, which is hereby incorporated by reference herein in its entirety.

What is claimed is:

1. A semiconductor apparatus comprising a semiconductor substrate having an upper surface on which a semiconductor element is disposed, a lower surface opposite to the upper surface, and a side surface connecting the upper surface and the lower surface, wherein the side surface has a plurality of concavities that each extend along the edge of the upper surface and that are arranged in a direction intersecting with the upper surface and the lower surface, and a plurality of ridges that are each located at the boundary between adjacent two of the plurality of concavities, and wherein the plurality of concavities and the plurality of ridges are covered with an insulating film containing carbon and fluorine.

2. The semiconductor apparatus according to claim 1, wherein the plurality of concavities include a first concavity and a second concavity that is further away from the edge of the upper surface than the first concavity, and
wherein the distance between two of the plurality of ridges that are located at the boundaries between the first concavity and two of the plurality of concavities that are adjacent to the first concavity is greater than or equal to the distance between two of the plurality of ridges that are located at the boundaries between the second concavity and two of the plurality of concavities that are adjacent to the second concavity.

3. The semiconductor apparatus according to claim 1, wherein the distance between two of the plurality of ridges that are located at the boundaries between each of the plurality of concavities and two of the plurality of concavities that are adjacent to each other decreases continuously or stepwise as the distance from the edge of the upper surface increases.

4. The semiconductor apparatus according to claim 1, wherein the side surface includes a first unevenness composed of adjacent two of the plurality of concavities and one of the plurality of ridges that is located at the boundary between the two concavities, and a second unevenness that is further away from the edge of the upper surface than the first unevenness, and
wherein the difference in level of the first unevenness is greater than or equal to the difference in level of the second unevenness.

5. The semiconductor apparatus according to claim 1, wherein the side surface is such that the difference in level of an unevenness composed of adjacent two of the plurality of concavities and one of the plurality of ridges that is located at the boundary between the two concavities decreases continuously or stepwise as the distance from the edge of the upper surface increases.

6. The semiconductor apparatus according to claim 1, wherein the insulating film has a first surface on the side of the side, and
wherein the second surface has higher flatness than the side surface.

7. The semiconductor apparatus according to claim 1, wherein the difference in level of a part of the second surface of the insulating film that is above an unevenness composed of adjacent two of the plurality of concavities and one of the plurality of ridges that is located at the boundary between the two concavities is smaller than the difference in level of the unevenness.

8. The semiconductor apparatus according to claim 1, wherein the thickness of a part of the insulating film that covers one ridge located at the boundary between adjacent two of the plurality of concavities is larger than the difference in level of an unevenness composed of the two concavities and the one ridge.

9. The semiconductor apparatus according to claim 1, wherein the film thickness of parts of the insulating film that cover the plurality of ridges is greater than or equal to 100 nm and less than or equal to 10 μm.

10. The semiconductor apparatus according to claim 1, wherein the insulating film further contains nitrogen.

11. The semiconductor apparatus according to claim 1, wherein each of the plurality of concavities has an arc shape.

12. The semiconductor apparatus according to claim 1, wherein the insulating film continuously covers the side surface from the edge of the upper surface to the edge of the lower surface.

13. The semiconductor apparatus according to claim 1, wherein the semiconductor element includes an image pickup element including a photoelectric conversion unit that generates a signal corresponding to incident light.

14. Equipment comprising the semiconductor apparatus according to claim 1 and a signal processing unit that processes a signal obtained by the semiconductor apparatus.

* * * * *